United States Patent
Gopu et al.

(10) Patent No.: US 12,526,958 B2
(45) Date of Patent: Jan. 13, 2026

(54) HYBRID DEVICE COOLING SYSTEM

(71) Applicant: QUALCOMM Incorporated, San Diego, CA (US)

(72) Inventors: Dhinesh Jambai Gopu, Bengaluru (IN); Thirukumaran Dechinamoorthy, Hyderabad (IN)

(73) Assignee: QUALCOMM INCORPORATED, San Diego, CA (US)

( * ) Notice: Subject to any disclaimer, the term of this patent is extended or adjusted under 35 U.S.C. 154(b) by 251 days.

(21) Appl. No.: 18/363,924

(22) Filed: Aug. 2, 2023

(65) Prior Publication Data
US 2025/0048592 A1 Feb. 6, 2025

(51) Int. Cl.
*H05K 7/20* (2006.01)

(52) U.S. Cl.
CPC ....... *H05K 7/20336* (2013.01); *H05K 7/2099* (2013.01)

(58) Field of Classification Search
CPC .......................... H05K 7/2099; H05K 7/20336
See application file for complete search history.

(56) References Cited

U.S. PATENT DOCUMENTS

| | | | |
|---|---|---|---|
| 2007/0257766 A1* | 11/2007 | Richards | ................. F28D 15/06 62/3.1 |
| 2020/0281096 A1 | 9/2020 | Shioga | |
| 2021/0359389 A1* | 11/2021 | Wang | ................... H01Q 9/0407 |
| 2022/0304189 A1 | 9/2022 | Luo et al. | |
| 2023/0022994 A1* | 1/2023 | Sun | ..................... H05K 7/20336 |
| 2023/0079287 A1 | 3/2023 | Kitamura et al. | |
| 2023/0200013 A1 | 6/2023 | Sano et al. | |

OTHER PUBLICATIONS

Advanced Cooling Techniques, "Vapor Chambers Explained—Benefits and Limitations", printed Aug. 2, 2023, 6 pgs.
International Search Report and Written Opinion—PCT/US2024/034323—ISA/EPO—Oct. 9, 2024.

* cited by examiner

*Primary Examiner* — Mukundbhai G Patel
(74) *Attorney, Agent, or Firm* — Moore IP

(57) ABSTRACT

A device includes a heat source, a vapor chamber, a bridge, and a heat pipe. The vapor chamber is in thermal communication with the heat source and comprises a working fluid. The heat pipe is in thermal communication with a heatsink and in fluid communication via the bridge with the vapor chamber.

30 Claims, 4 Drawing Sheets

HYBRID DEVICE COOLING SYSTEM

FIELD

Various features relate to thermal management in devices.

BACKGROUND

State-of-the-art mobile application devices demand a small form factor, low cost, a tight power budget, and high electrical performance. Mobile package design has evolved to meet these divergent goals for enabling mobile applications that support multimedia enhancements. These mobile application devices, however, are susceptible to uneven heating and overheating with multiple heat sources arranged within the small form factor.

SUMMARY

Various features relate to thermal management in devices.

One example provides a device that includes a heat source, a vapor chamber, a bridge, and a heat pipe. The vapor chamber is in thermal communication with the heat source and comprises a working fluid. The heat pipe is in thermal communication with a heatsink and in fluid communication via the bridge with the vapor chamber.

Another example provides a device that includes a heat pipe, a bridge, and a vapor chamber. The heat pipe is in thermal communication with a heat source. The vapor chamber comprises a working fluid and is in fluid communication via the bridge with the heat pipe.

Another example provides a method that includes forming a vapor chamber and forming a heat pipe. The method also includes forming a bridge between the vapor chamber and the heat pipe to enable fluid communication therebetween. The method further includes adding a working fluid into a volume defined by the vapor chamber, the heat pipe, and the bridge.

Another example provides a method that includes transporting heat from a heat source to a working fluid within a first heat exchange device. The method also includes transporting the working fluid, via a bridge, to a second heat exchange device. The method further includes transporting heat from the working fluid within the second heat exchange device to a heatsink. One of the first heat exchange device and the second heat exchange device is a vapor chamber and the other of the first heat exchange device and the second heat exchange device is a heat pipe.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Particular aspects of the present disclosure are described below with reference to the drawings. In the description, common features are designated by common reference numbers. As used herein, various terminology is used for the purpose of describing particular implementations only and is not intended to be limiting of implementations. For example, the singular forms "a," "an," and "the" are intended to include the plural forms as well, unless the context clearly indicates otherwise. Further, some features described herein are singular in some implementations and plural in other implementations. For ease of reference herein, such features are generally introduced as "one or more" features and are subsequently referred to in the singular or optional plural (as indicated by "(s)") unless aspects related to multiple of the features are being described.

As used herein, the terms "comprise," "comprises," and "comprising" may be used interchangeably with "include," "includes," or "including." As used herein, "exemplary" indicates an example, an implementation, and/or an aspect, and should not be construed as limiting or as indicating a preference or a preferred implementation. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). As used herein, the term "set" refers to one or more of a particular element, and the term "plurality" refers to multiple (e.g., two or more) of a particular element.

State-of-the-art mobile application devices demand a small form factor, low cost, a tight power budget, and high electrical performance. Mobile package design has evolved to meet these divergent goals for enabling mobile applications that support multimedia enhancements. For example, a mobile application device can include multiple antenna modules and a system-on-chip (SoC) that includes one or more processors. These mobile applications, however, are susceptible to overheating issues when multiple heat sources (e.g., the antenna modules and SoC) are arranged within the small form factor.

Various aspects of the present disclosure provide a hybrid device cooling system that includes a vapor chamber and a heat pipe that is in fluid communication via a bridge with the vapor chamber. The vapor chamber and the heat pipe can be coupled to one or more heat sources, resulting in improved thermal distribution.

Exemplary Implementations Including a Hybrid Cooling System

Figures 1A, 1B, 1C:
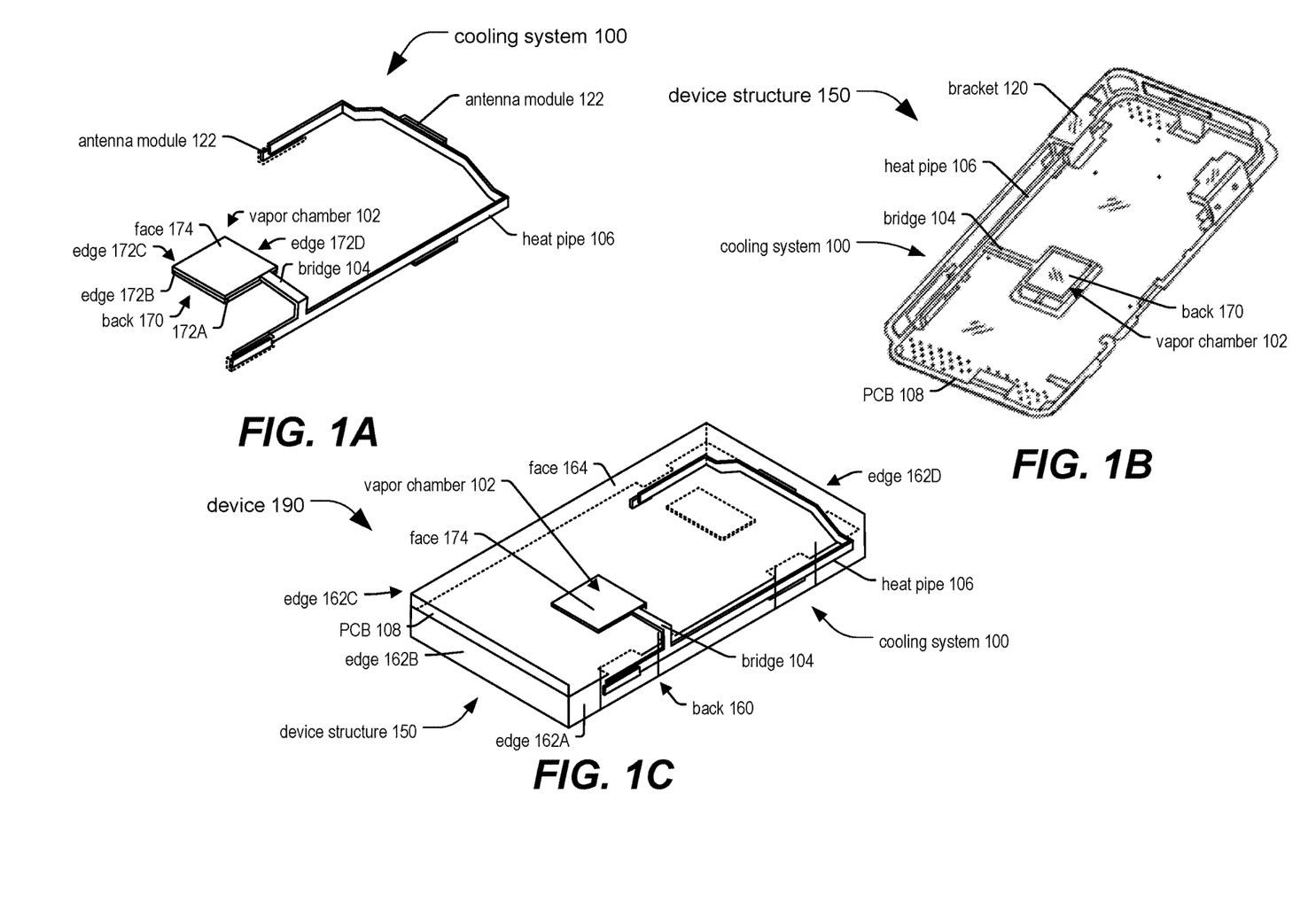
FIG. 1A illustrates a particular implementation of a hybrid device cooling system.
FIG. 1B illustrates a particular implementation of a device structure that includes the hybrid device cooling system of FIG. 1A.
FIG. 1C illustrates a particular implementation of a device that includes the device structure of FIG. 1B.

FIG. 1A illustrates a particular implementation of a cooling system 100 (e.g., a hybrid cooling system) that includes a vapor chamber 102 coupled via a bridge 104 with a heat pipe 106. In FIG. 1A, a top view of the cooling system 100 is shown.

In a particular aspect, the vapor chamber 102 corresponds to a rectangular container. For example, the vapor chamber 102 has a face 174, a back 170, and four edges 172 (e.g., an edge 172A, an edge 172B, an edge 172C, and an edge 172D) defining a space therebetween. The face 174 is opposite the back 170, the edge 172A is opposite the edge 172C, and the edge 172B is opposite the edge 172D. In a particular aspect, a surface area of the face 174 is greater than a surface area of each of the edges 172, and is the same as a surface area of the back 170. In a particular aspect, the heat pipe 106 corresponds to a hollow tube.

In a particular aspect, the vapor chamber 102, the bridge 104, and the heat pipe 106 are made of conductive materials (e.g., copper, aluminum, or both). The bridge 104 is formed between the vapor chamber 102 and the heat pipe 106 to enable fluid communication therebetween. According to some implementations, a wicking structure extends between the vapor chamber 102 and the heat pipe 106. In an example, the vapor chamber 102 includes a first portion of the wicking structure, the bridge 104 includes a second portion of the wicking structure, and the heat pipe 106 includes a third portion of the wicking structure. According to some implementations, a grain size of the wicking structure is greater than or equal to 8 microns and less than or equal to 12 microns. In a particular example, a characteristic grain size of the wicking structure is approximately equal to 10 microns.

A working fluid is added in a volume defined by the vapor chamber 102, the bridge 104, and the heat pipe 106. In some implementations, the working fluid includes water, distilled water, acetone, one or more additives, or a combination thereof. The working fluid has greater than threshold thermal conductivity (e.g., greater than or equal to 0.6 watts per meter-kelvin at room temperature (25 degrees Celsius)) and lower than threshold boiling point (e.g., less than or equal to 100 degrees Celsius). In some implementations, an operating pressure of the cooling system 100 may be set to achieve a lower boiling point (e.g., less than or equal to room temperature). The working fluid enables the heat pipe 106 to be in fluid communication via the bridge 104 with the vapor chamber 102.

In an example, the vapor chamber 102 is in thermal communication with a heat source coupled to (e.g., proximate to) the vapor chamber 102. In a particular aspect, the heat source includes one or more processors, a system-on-chip (SoC) including one or more processors, a central processing unit (CPU), a graphics processing unit (GPU), an audio processor, a video processor, a display, or a combination thereof. When the heat source produces heat, air inside the vapor chamber 102 warms up and the working fluid undergoes a phase change from liquid to vapor at a relatively low temperature. According to some implementations, the vapor chamber 102 includes one or more evaporator portions where heat from the heat source is applied to the working fluid and the working fluid undergoes the phase change from liquid to vapor.

As the working fluid (e.g., as vapor) spreads away from the heat source, the working fluid passes from the vapor chamber 102 via the bridge 104 to the heat pipe 106. When the working fluid encounters cooler regions of the heat pipe 106, the working fluid condenses to a liquid phase. According to some implementations, the heat pipe 106 is in thermal communication with one or more heatsinks. The one or more heatsinks include an ambient environment, a heat spreader, or both. A region of the heat pipe 106, cooled by a heatsink, causes the working fluid in the region to condense. The working fluid (e.g., as liquid) flows back via the bridge 104 to the vapor chamber 102. In a particular aspect, the working fluid flows back from the heat pipe 106 via the wicking structure (e.g., via capillary action) to the vapor chamber 102.

In a particular aspect, the vapor chamber 102 includes one or more condenser portions where the working fluid (e.g., as vapor) condenses back into a liquid state. For example, the one or more condenser portions are coupled to one or more heatsinks. The working fluid can move away from the one or more evaporator portions of the vapor chamber 102 to the one or more condenser portions and via the bridge 104 to the heat pipe 106.

According to some implementations, the heat pipe 106 is in thermal communication with one or more additional heat sources (e.g., antenna modules 122). In an example, an antenna module 122 includes a fifth generation (5G) millimeter wave (mmWave) beamer. It should be understood that antenna modules 122 are used as an illustrative example of heat sources, in other examples, the heat pipe 106 can be in thermal communication with one or more other types of heat sources.

In a particular aspect, the heat pipe 106 includes one or more evaporator portions and one or more condenser portions. In an example, an evaporator section is in thermal communication with a heat source and a condenser portion is in thermal communication with a heatsink. For example, the evaporator portion is coupled to an antenna module 122, and the condenser portion is exposed to an ambient environment, coupled to a heat spreader, or both. When the heat source generates heat, the working fluid in the evaporator portion absorbs the heat and undergoes a phase change from liquid to vapor. The working fluid moves away from the heat source towards the condenser portion and condenses back to a liquid phase.

FIG. 1B illustrates a device structure 150 that includes the cooling system 100 coupled to a printed circuit board (PCB) 108. In FIG. 1B, a bottom view of the cooling system 100 is shown. According to some implementations, the vapor chamber 102 and the bridge 104 are embedded in the PCB 108.

In a particular aspect, the device structure 150 includes one or more brackets 120 coupled to the heat pipe 106. A heat source (e.g., an antenna module 122) can be attached to a bracket 120 to enable thermal communication between the heat pipe 106 and the heat source. For example, a portion of the heat pipe 106 is located on the bracket 120, and the bracket 120 is in thermal communication with the heat source. In a particular implementation, at least a portion of the heat pipe 106 is located on a periphery of the PCB 108 to enable the heat pipe 106 to be in thermal communication with an ambient environment.

FIG. 1C illustrates a device 190 that includes the device structure 150. In FIG. 1C, a top view of the cooling system 100 is shown. In a particular aspect, the device 190 includes at least one of a mobile device, a mobile test platform (MTP), a laptop, a communication device, or an internet-of-things (IoT) device. In an example, the vapor chamber 102, the bridge 104, the heat pipe 106, one or more heat sources, or a combination thereof are integrated into at least one of a mobile device, a MTP, a laptop, a communication device, or an IoT device.

In a particular aspect, the device 190 is rectangular-shaped. For example the device 190 includes a face 164, a back 160, and four edges 162 (e.g., an edge 162A, an edge 162B, an edge 162C, and an edge 162D). The face 164 is opposite the back 160, the edge 162A is opposite the edge 162C, and the edge 162B is opposite the edge 162D. In a particular aspect, a surface area of the face 164 is greater than a surface area of each of the edges 162, and is the same as a surface area of the back 160.

In a particular aspect, the face 174 of the vapor chamber 102 is aligned with the face 164 of the device 190. In a particular aspect, the back 170 of the vapor chamber 102 is aligned with the back 160 of the device 190. In a particular aspect, a heat source (not shown) of the device 190 is coupled to (e.g., proximate or adjacent to) the back 170 of the vapor chamber 102. For example, a SoC including one or more processors is coupled to the back 170 of the vapor chamber 102. As another example, one or more processors are coupled to the back 170 of the vapor chamber 102. In a particular aspect, the vapor chamber 102 is between the heat source and the face 164 of the device 190. According to some implementations, a display of the device 190 is between the face 174 of the vapor chamber 102 and the face 164 of the device 190.

In a particular aspect, a first portion of the bridge 104 is located along the face 164 of the device 190 and a second portion of the bridge 104 is located along the edge 162A. In a particular aspect, at least a portion of the heat pipe 106 is located on a periphery of the device 190. For example, a first portion of the heat pipe 106 is located along at least a portion of the edge 162A, a second portion of the heat pipe 106 is located along the edge 162D, and a third portion of the heat pipe 106 is located along at least a portion of the edge 162C. In a particular implementation, the device 190 includes a mobile device, and at least a portion of the heat pipe 106 is located on a bezel of the mobile device.

Locating at least a portion of the heat pipe 106 along the periphery of the device 190 enables exposing the portion of the heat pipe 106 to ambient environment and keeping the heat pipe 106 away from one or more heat sources (such as the SoC, processor(s), etc.). In some examples, a particular heat source (e.g., an antenna module 122) that is active generates more heat than another heat source (e.g., another antenna module 122) that is inactive, a technical advantage of the cooling system 100 includes enabling thermal distribution to reduce a temperature difference between the active and inactive regions, thereby preventing the active region from overheating.

It should be understood that particular implementations of the vapor chamber 102, the bridge 104, and the heat pipe 106 are provided as illustrative examples, in other examples the vapor chamber 102, the bridge 104, the heat pipe 106, or a combination thereof can have other locations, other shapes, other dimensions, or a combination thereof.

In a particular aspect, one or more portions of the heat pipe 106 are angled based on an intended location of a heat source (e.g., an antenna module 122). Although FIGS. 1A, 1B, and 1C illustrate the cooling system 100 as including a single vapor chamber 102 and a single heat pipe 106, in some other examples the cooling system 100 can include one or more vapor chambers 102 coupled to one or more heat pipes 106. To illustrate, in a particular example, multiple vapor chambers 102 are in fluid communication via the bridge 104 with the heat pipe 106. In another example, a first vapor chamber 102 is in fluid communication via a first bridge 104 with the heat pipe 106, and a second vapor chamber 102 is in fluid communication via a second bridge 104 with the heat pipe 106. In yet another example, a first vapor chamber 102 is in fluid communication via a first bridge 104 with a first heat pipe 106, and a second vapor chamber 102 is in fluid communication via a second bridge 104 with a second heat pipe 106.

Figure 2A:
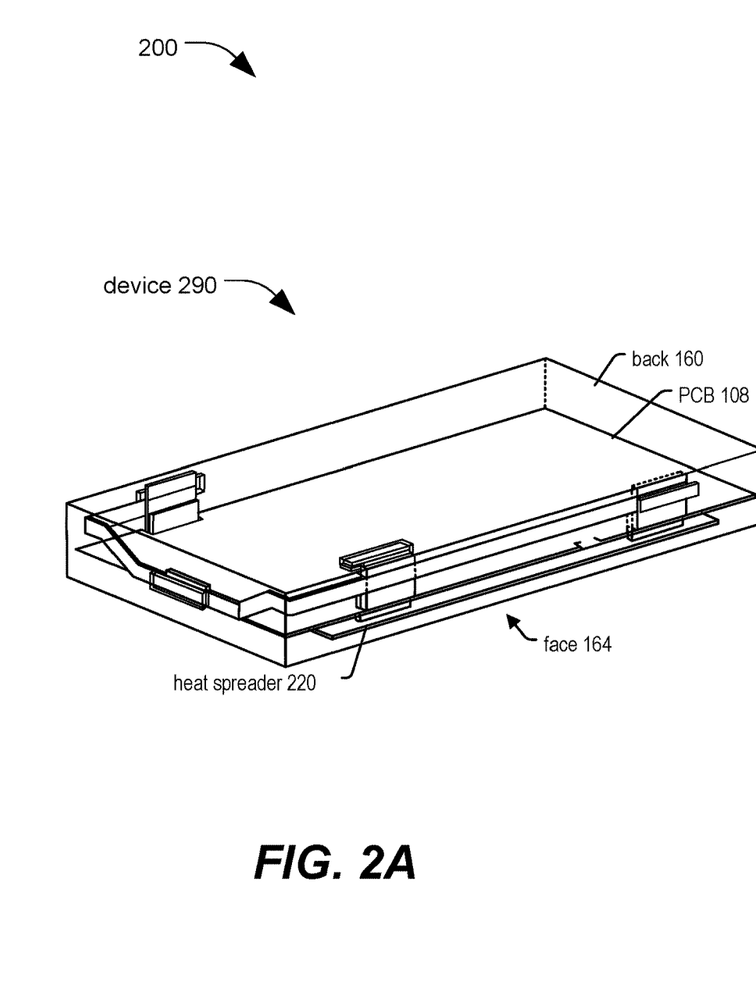
FIG. 2A illustrates a perspective view of a particular implementation of a device that includes the device structure of FIG. 1B.
Figure 2B:
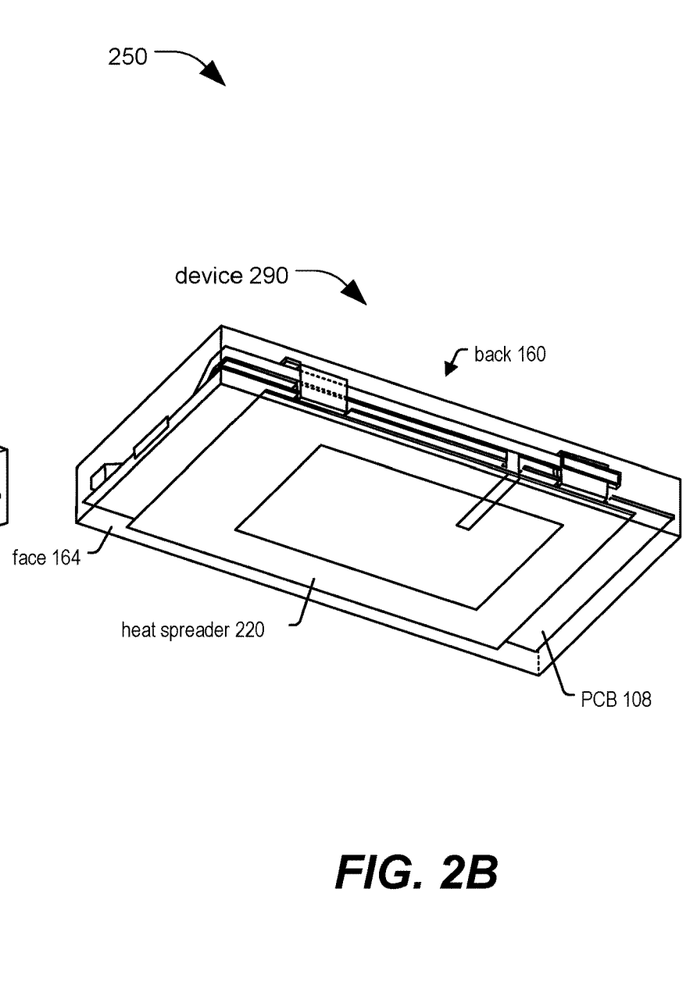
FIG. 2B illustrates a perspective view of a particular implementation of a device that includes the device structure of FIG. 1B.

FIG. 2A illustrates a perspective view 200 of a particular implementation of a device 290 that includes the device structure 150 of FIG. 1B, and FIG. 2B illustrates another perspective view 250 of the device 290.

The device 290 includes many of the same components and features as are described above with reference to FIGS. 1A-C. Such components and features are physically and operationally the same as described above with reference to FIGS. 1A-C and are labeled in FIGS. 2A and 2B using the same reference numbers. In some implementations, the device 290 includes all of the same features and components as the cooling system 100 of FIG. 1A, the device structure 150 of FIG. 1B, the device 190 of FIG. 1C, or a combination thereof; however, some components and features illustrated in FIGS. 1A-C have been omitted from (or are not labeled with reference numbers in) FIGS. 2A and 2B for simplicity of illustration and to highlight differences between the device 290 and one or more of the cooling system 100, the device structure 150, or the device 190. Omission of such features and reference numbers should not be understood as limiting the features and components of FIGS. 2A and 2B to only those specifically called out below. For example, while FIG. 2A does not show a label for a bracket 120 of FIG. 1B, the device 290 can include a bracket 120.

The device 290 includes a heat spreader 220 between the PCB 108 and the face 164. In a particular aspect, the device 290 includes a display (e.g., a touchscreen) between the PCB 108 and the face 164. In a particular aspect, the heat spreader 220 is between the PCB 108 (e.g., including the vapor chamber 102) and the display. In a particular aspect, the cooling system 100 is coupled to the heat spreader 220. For example, a portion of the heat pipe 106 is coupled to the heat spreader 220. A technical advantage of the heat spreader 220 coupled to the heat pipe 106 can include providing additional thermal distribution.

Figure 3:
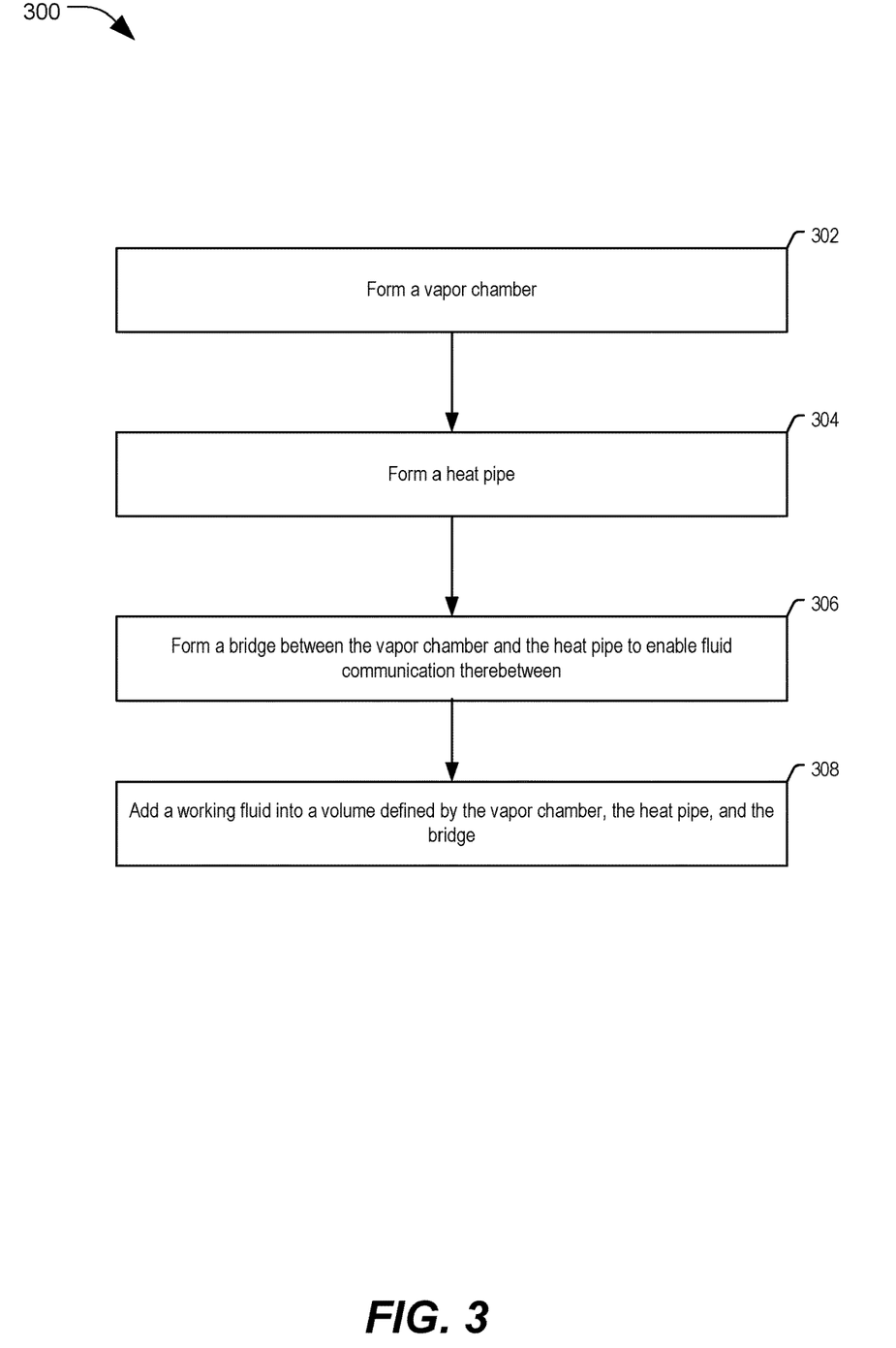
FIG. 3 illustrates an exemplary flow diagram of a method for fabricating a hybrid device cooling system.

Exemplary Flow Diagram of a Method for Fabricating a Hybrid Device Cooling System In some implementations, fabricating a hybrid device cooling system includes several processes. FIG. 3 illustrates an exemplary flow diagram of a method 300 for providing or fabricating a hybrid device cooling system. In some implementations, the method 300 of FIG. 3 may be used to provide or fabricate the cooling system 100 of FIG. 1A.

It should be noted that the method 300 of FIG. 3 may combine one or more processes in order to simplify and/or clarify the method for providing or fabricating a hybrid device cooling system. In some implementations, the order of the processes may be changed or modified.

The method 300 includes, at block 302, forming a vapor chamber. For example, high conductivity materials (e.g., copper, aluminum, stainless steel, or a combination thereof) are stamped or milled to generate a base plate corresponding to the back 170 of the vapor chamber 102 and a cover plate corresponding to the face 174 of the vapor chamber 102. The base plate and the cover plate are assembled to form the vapor chamber 102.

The method 300 includes, at block 304, forming a heat pipe. For example, a high conductivity tube (e.g., copper, aluminum, stainless steel, or a combination thereof) is evacuated to form a vacuum. The evacuated tube corresponds to the heat pipe 106.

The method 300 includes, at block 306, forming a bridge between the vapor chamber and the heat pipe to enable fluid communication therebetween. For example, a high conductivity tube (e.g., copper, aluminum, stainless steel, or a combination thereof) is evacuated to form a vacuum. The evacuated tube corresponds to the bridge 104. For example, a first evacuated tube corresponding to the bridge 104 is connected to the base plate, the cover plate, or both, of the vapor chamber 102 and to a second evacuated tube corresponding to the heat pipe 106 to enable fluid communication therebetween. In a particular implementation, a hole is made on a side of the second evacuated tube and an opening of the first evacuated tube is attached to the hole.

The method 300 includes, at block 308, adding a working fluid into a volume defined by the vapor chamber, the heat pipe, and the bridge. For example, a working fluid is added into a volume defined by the vapor chamber 102, the bridge 104, and the heat pipe 106. In a particular implementation, the bridge 104 is attached to the vapor chamber 102 and to the heat pipe 106 prior to adding the working fluid, and the cooling system 100 is (e.g., the vapor chamber 102, the bridge 104, and the heat pipe 106 are) sealed after adding the working fluid.

In a particular implementation, the method 300 includes forming a wicking structure that extends between the vapor chamber and the heat pipe. For example, a wicking structure is formed from materials such as sintered metal, screen mesh, grooved surfaces, or a combination thereof. In a particular aspect, the wicking structure is inserted through the heat pipe 106 and the bridge 104 into the vapor chamber 102. In a particular aspect, the wicking structure is inserted after the bridge 104 is attached to the vapor chamber 102, the heat pipe 106, or both.

According to some implementations, the wicking structure is fabricated in the cooling system 100 (e.g., the vapor chamber 102, the bridge 104, and the heat pipe 106). For example, the cooling system 100 includes molten metal and a gas is injected into the molten metal to form a foam-like structure as the wicking structure.

In a particular aspect, the working fluid is added before forming (e.g., inserting or fabricating) the wicking structure. In an alternative aspect, the working fluid is added after forming (e.g., inserting or fabricating) the wicking structure. The cooling system 100 is sealed after the wicking structure is formed (e.g., inserted or fabricated) and the working fluid is added.

In a particular implementation, the heat pipe 106 is shaped (e.g., bent or angled) to achieve a pre-determined configuration. In a particular implementation, the heat pipe 106 is shaped prior to forming the wicking structure in the cooling system 100. In an alternative implementation, the heat pipe 106 is shaped after forming the wicking structure in the cooling system 100.

Exemplary Flow Diagram of a Method of Using a Hybrid Device Cooling System

Figure 4:
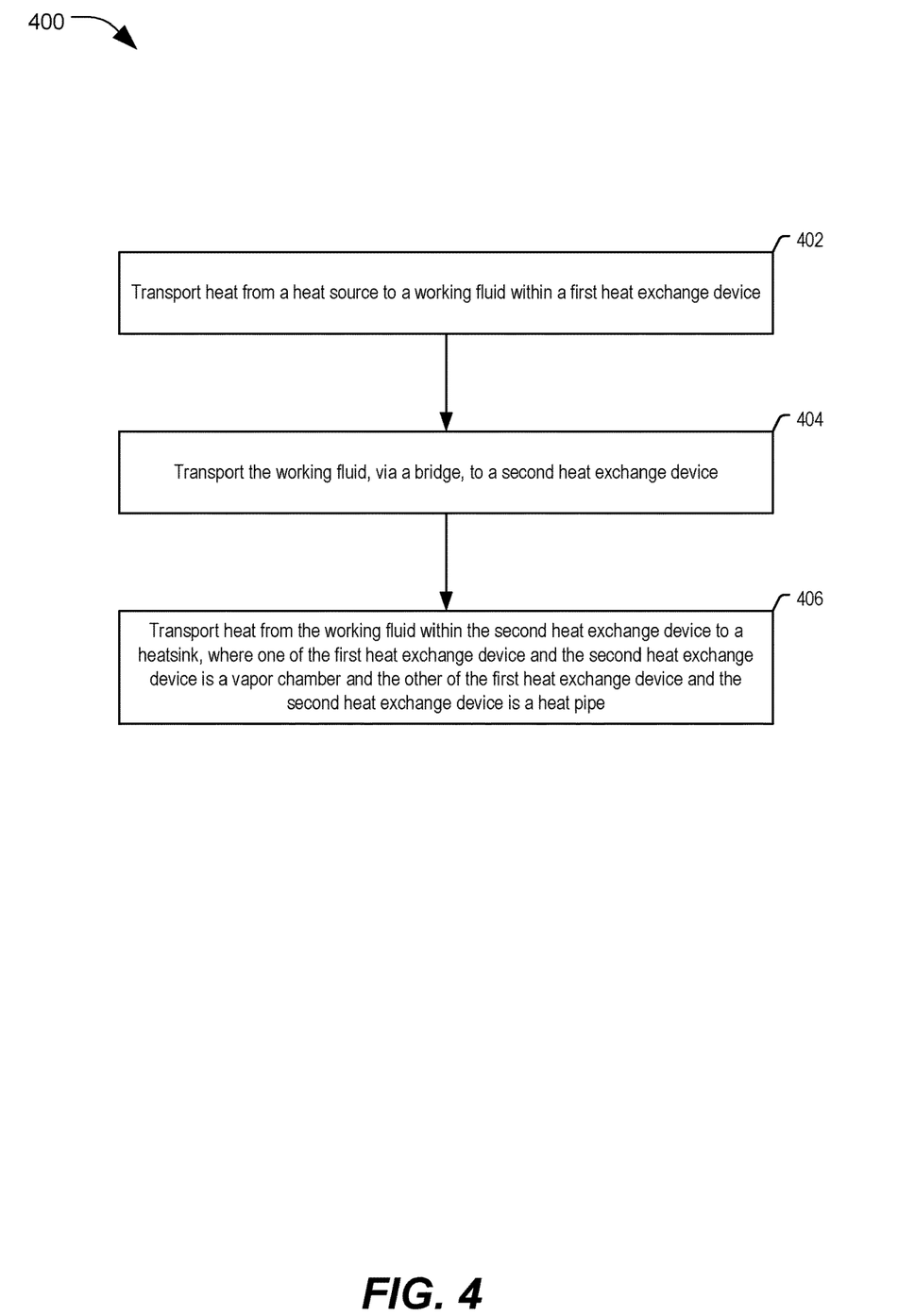
FIG. 4 illustrates an exemplary flow diagram of a method of using a hybrid device cooling system.

In some implementations, using a hybrid device cooling system includes several processes. FIG. 4 illustrates an exemplary flow diagram of a method 400 of using a hybrid device cooling system. In some implementations, the method 400 of FIG. 4 is of using the cooling system 100 of FIG. 1A.

It should be noted that the method 400 of FIG. 4 may combine one or more processes in order to simplify and/or clarify the method of using a hybrid device cooling system. In some implementations, the order of the processes may be changed or modified.

The method 400 includes, at block 402, transporting heat from a heat source to a working fluid within a first heat exchange device. In a first example, heat from a heat source (e.g., a SoC of the device 190 or the device 290) is transported to a working fluid within the vapor chamber 102. In a second example, heat from a heat source (e.g., a SoC of the device 190 or the device 290) is transported to a working fluid within the heat pipe 106.

The method 400 includes, at block 404, transporting the working fluid, via a bridge, to a second heat exchange device. In the first example, the working fluid is transported from the vapor chamber 102 via the bridge 104 to the heat pipe 106. In the second example, the working fluid is transported from the heat pipe 106 via the bridge 104 to the vapor chamber 102.

The method 400 includes, at block 406, transporting heat from the working fluid within the second heat exchange device to a heatsink, where one of the first heat exchange device and the second heat exchange device is a vapor chamber and the other of the first heat exchange device and the second heat exchange device is a heat pipe. In the first example, heat from the working fluid within the heat pipe 106 is transported to a heatsink (e.g., ambient environment, the heat spreader 220, or both). In the second example, heat from the working fluid within the vapor chamber 102 is transported to a heatsink (e.g., a condenser portion of the vapor chamber 102).

One or more of the components, processes, features, and/or functions illustrated in FIGS. 1A-4 may be rearranged and/or combined into a single component, process, feature or function or embodied in several components, processes, or functions. Additional elements, components, processes, and/or functions may also be added without departing from the disclosure. In some implementations, FIGS. 1A-4 and its corresponding description may be used to manufacture, create, provide, and/or produce hybrid cooling systems and/or devices including hybrid cooling systems.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. An object A, that is coupled to an object B, may be coupled to at least part of object B. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to as a second component, may be the first component, the second component, the third component or the fourth component. The terms "encapsulate", "encapsulating" and/or any derivation means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. A value that is about X-XX, may mean a value that is between X and XX, inclusive of X and XX. The value(s) between X and XX may be discrete or continuous. The term "about 'value X'", or "approximately value X", as used in the disclosure means within 10 percent of the 'value X'. For example, a value of about 1 or approximately 1, would mean a value in a range of 0.9-1.1. A "plurality" of components may include all the possible components or only some of the components from all of the possible components. For example, if a device includes ten components, the use of the term "the plurality of components" may refer to all ten components or only some of the components from the ten components.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the disclosure.

According to Example 1, a device includes a heat source; a vapor chamber in thermal communication with the heat source and comprising a working fluid; a bridge; and a heat pipe in thermal communication with a heatsink and in fluid communication via the bridge with the vapor chamber.

Example 2 includes the device of Example 1, wherein the heatsink includes an ambient environment, a heat spreader, or both.

Example 3 includes the device of Example 1 or Example 2, wherein the heat pipe is in thermal communication with one or more additional heat sources.

Example 4 includes the device of any of Examples 1 to 3, wherein at least a portion of the heat pipe is located at a periphery of the device.

Example 5 includes the device of any of Examples 1 to 4, wherein a face of the vapor chamber is aligned with a face of the device.

Example 6 includes the device of any of Examples 1 to 5, wherein a first portion of the bridge is located along a face of the device and a second portion of the bridge is located along an edge of the device.

Example 7 includes the device of any of Examples 1 to 6 and further includes a wicking structure that extends between the vapor chamber and the heat pipe.

Example 8 includes the device of Example 7, wherein a grain size of the wicking structure is approximately equal to 10 microns.

Example 9 includes the device of Example 7 or Example 8, wherein a grain size of the wicking structure is greater than or equal to 8 microns and less than or equal to 12 microns.

Example 10 includes the device of any of Examples 1 to 9 and further includes a bracket in thermal communication with an additional heat source, wherein a portion of the heat pipe is located on the bracket.

Example 11 includes the device of Example 10, wherein the additional heat source includes an antenna module.

Example 12 includes the device of any of Examples 1 to 11, wherein the vapor chamber is coupled to a system-on-chip (SoC) that includes one or more processors.

Example 13 includes the device of Example 12, wherein the heat source includes the one or more processors.

Example 14 includes the device of any of Examples 1 to 13 and further includes one or more additional vapor chambers in fluid communication via the bridge with the heat pipe.

Example 15 includes the device of any of Examples 1 to 14, further includes a display; and a heat spreader between the vapor chamber and the display.

Example 16 includes the device of any of Examples 1 to 15, wherein the heat source, the vapor chamber, the bridge, and the heat pipe are integrated into a mobile device.

Example 17 includes the device of Example 16, wherein at least a portion of the heat pipe is located on a bezel of the mobile device.

Example 18 includes the device of any of Examples 1 to 17, wherein the heat source, the vapor chamber, the bridge, and the heat pipe are integrated into at least one of a mobile test platform (MTP), a laptop, a communication device, or an internet-of-things (IoT) device.

According to Example 19, a device includes a heat pipe in thermal communication with a heat source; a bridge; and a vapor chamber comprising a working fluid and in fluid communication via the bridge with the heat pipe.

Example 20 includes the device of Example 19, further comprising a bracket in thermal communication with the heat source, wherein a portion of the heat pipe is located on the bracket.

Example 21 includes the device of Example 19 or Example 20, wherein the heat source includes an antenna module.

Example 22 includes the device of Example 21, wherein the antenna module includes a fifth generation (5G) millimeter wave (mmWave) beamer.

Example 23 includes the device of any of Examples 19 to 22, wherein the vapor chamber is coupled to a system-on-chip (SoC) that includes one or more processors.

Example 24 includes the device of any of Examples 19 to 23 and further includes one or more additional vapor chambers in fluid communication via the bridge with the heat pipe.

Example 25 includes the device of any of Examples 19 to 24, further includes a display; and a heat spreader between the vapor chamber and the display.

Example 26 includes the device of any of Examples 19 to 25, wherein the heat pipe, the bridge, and the vapor chamber are integrated into a mobile device.

Example 27 includes the device of Example 26, wherein at least a portion of the heat pipe is located on a bezel of the mobile device.

According to Example 28, a method includes forming a vapor chamber; forming a heat pipe; forming a bridge between the vapor chamber and the heat pipe to enable fluid communication therebetween; and adding a working fluid into a volume defined by the vapor chamber, the heat pipe, and the bridge.

Example 29 includes the method of Example 28, forming a wicking structure that extends between the vapor chamber and the heat pipe.

According to Example 30, a method includes transporting heat from a heat source to a working fluid within a first heat exchange device; transporting the working fluid, via a bridge, to a second heat exchange device; and transporting heat from the working fluid within the second heat exchange device to a heatsink, wherein one of the first heat exchange device and the second heat exchange device is a vapor chamber and the other of the first heat exchange device and the second heat exchange device is a heat pipe.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A device comprising:
a device structure, wherein the device structure includes a first edge, a second edge, and a third edge opposite the first edge;
a heat source positioned between the first edge and the third edge;
a vapor chamber in thermal communication with the heat source and comprising a working fluid;
a bridge;
a heat pipe in thermal communication with a heatsink and in fluid communication via the bridge with the vapor chamber; and
a plurality of additional heat sources in thermal communication with the heat pipe, wherein the plurality of additional heat sources include a first additional heat source coupled to the first edge and the heat pipe, a second additional heat source coupled to the second edge and the heat pipe, and a third additional heat source coupled to the third edge and the heat pipe.

2. The device of claim 1, wherein the heatsink includes an ambient environment, a heat spreader, or both.

3. The device of claim 1, wherein the bridge couples to the heat pipe between the first additional heat source and a fourth additional heat source coupled to the first edge and the heat pipe.

4. The device of claim 1, further comprising a printed circuit board, wherein the heat source is coupled to the printed circuit board.

5. The device of claim 1, wherein a face of the vapor chamber is aligned with a face of the device.

6. The device of claim 1, wherein a first portion of the bridge is located along a face of the device and a second portion of the bridge is located along an edge of the device.

7. The device of claim 1, further comprising a wicking structure that extends between the vapor chamber and the heat pipe.

8. The device of claim 7, wherein a grain size of the wicking structure is approximately equal to 10 microns.

9. The device of claim 7, wherein a grain size of the wicking structure is greater than or equal to 8 microns and less than or equal to 12 microns.

10. The device of claim 1, further comprising a bracket in thermal communication with the first additional heat source, wherein a portion of the heat pipe is coupled to the bracket.

11. The device of claim 10, wherein the first additional heat source includes an antenna module.

12. The device of claim 1, wherein the vapor chamber is coupled to a system-on-chip (SoC) that includes one or more processors.

13. The device of claim 12, wherein the heat source includes the one or more processors.

14. The device of claim 1, further comprising one or more additional vapor chambers in fluid communication via the bridge with the heat pipe.

15. The device of claim 1, further comprising:
a display; and
a heat spreader between the vapor chamber and the display.

16. The device of claim 1, wherein the heat source, the vapor chamber, the bridge, and the heat pipe are integrated into a mobile device.

17. The device of claim 16, wherein at least a portion of the heat pipe is located on a bezel of the mobile device.

18. The device of claim 1, wherein the heat source, the vapor chamber, the bridge, and the heat pipe are integrated into at least one of a mobile test platform (MTP), a laptop, a communication device, or an internet-of-things (IoT) device.

19. A device comprising:
a device structure including a first edge, a second edge, and a third edge opposite the first edge;
a heat pipe in thermal communication with a plurality of heat sources, wherein the plurality of heat sources include a first heat source coupled to the first edge and the heat pipe, a second heat source coupled to the second edge and the heat pipe, and a third heat source coupled to the third edge and the heat pipe;
a bridge; and
a vapor chamber comprising a working fluid and in fluid communication via the bridge with the heat pipe.

20. The device of claim 19, further comprising a bracket in thermal communication with the first heat source, wherein a portion of the heat pipe is located on the bracket.

21. The device of claim 19, wherein the first heat source includes an antenna module.

22. The device of claim 21, wherein the antenna module includes a fifth generation (5G) millimeter wave (mmWave) beamer.

23. The device of claim 19, wherein the vapor chamber is coupled to a system-on-chip (SoC) that includes one or more processors.

24. The device of claim 19, further comprising one or more additional vapor chambers in fluid communication via the bridge with the heat pipe.

25. The device of claim 19, further comprising:
a display; and
a heat spreader between the vapor chamber and the display.

26. The device of claim 19, wherein the heat pipe, the bridge, and the vapor chamber are integrated into a mobile device.

27. The device of claim 26, wherein at least a portion of the heat pipe is located on a bezel of the mobile device.

28. A method comprising:
forming a vapor chamber configured to perform thermal management of a device, wherein the device includes a device structure having a first edge, a second edge, and a third edge opposite the first edge;
forming a heat pipe, wherein the heat pipe is configured to be in thermal communication with a plurality of heat sources including a first heat source coupled to the first edge and the heat pipe, a second heat source coupled to the second edge and the heat pipe, and a third heat source coupled to the third edge and the heat pipe;
forming a bridge between the vapor chamber and the heat pipe to enable fluid communication therebetween; and
adding a working fluid into a volume defined by the vapor chamber, the heat pipe, and the bridge.

29. The method of claim 28, forming a wicking structure that extends between the vapor chamber and the heat pipe.

30. A method comprising:
transporting heat from a heat source to a working fluid within a first heat exchange device;
transporting the working fluid, via a bridge, to a second heat exchange device; and
transporting heat from the working fluid within the second heat exchange device to a heatsink, wherein one of the first heat exchange device and the second heat exchange device is a vapor chamber and the other of the first heat exchange device and the second heat exchange device is a heat pipe, wherein the heat pipe is coupled to a device structure, wherein the device structure includes a first edge, a second edge, and a third edge opposite the first edge; wherein the heat pipe is thermally coupled to a plurality of additional heat sources; wherein the plurality of additional heat sources include a first additional heat source coupled to the first edge and the heat pipe, a second additional heat source coupled to the second edge and the heat pipe, and a third additional heat source coupled to the third edge and the heat pipe; and wherein the heat pipe is configured to provide cooling for a particular additional heat source at a higher temperature than a temperature of an ambient environment.

* * * * *